(12) United States Patent
Iizuka et al.

(10) Patent No.: US 6,596,602 B2
(45) Date of Patent: Jul. 22, 2003

(54) METHOD OF FABRICATING A HIGH DIELECTRIC CONSTANT METAL OXIDE CAPACITY INSULATOR FILM USING ATOMIC LAYER CVD

(75) Inventors: Toshihiro Iizuka, Tokyo (JP); Tomoe Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/053,598

(22) Filed: Jan. 24, 2002

(65) Prior Publication Data
US 2002/0102810 A1 Aug. 1, 2002

(30) Foreign Application Priority Data
Jan. 29, 2001 (JP) .................................. 2001-020514

(51) Int. Cl.[7] ..................... H01L 27/108; H01L 21/8242
(52) U.S. Cl. ........................................ 438/396; 438/785
(58) Field of Search ................................ 438/396, 785, 438/778

(56) References Cited

U.S. PATENT DOCUMENTS

| | | | |
|---|---|---|---|
| 6,287,965 B1 * | 9/2001 | Kang et al. ................ | 438/648 |
| 6,420,230 B1 * | 7/2002 | Derderian et al. .......... | 438/253 |
| 2001/0051444 A1 * | 12/2001 | Lim et al. .................. | 438/778 |
| 2002/0000598 A1 * | 1/2002 | Kang et al. ................ | 257/301 |
| 2002/0020869 A1 * | 2/2002 | Park et al. ................. | 257/306 |
| 2002/0058391 A1 * | 5/2002 | Kim et al. .................. | 438/396 |

OTHER PUBLICATIONS

P-Y. Lesaicherre et al., "A Gbit-scale DRAM stacked capacitor technology with ECR MOCVD SrToO3 and RIE patterned RuO2/TiN storage nodes", (IEDM) International Electron Devices Meeting, Digest of Technical Papers, pp. 831–834 with Abstract.

* cited by examiner

Primary Examiner—Richard Elms
Assistant Examiner—Beth E. Owens
(74) Attorney, Agent, or Firm—Sughrue Mion, PLLC (57) ABSTRACT

The method for fabricating a semiconductor device in accordance with the present invention has the steps of: forming a metal film as a lower electrode of a capacitor on a semiconductor substrate, followed by forming a capacity insulator film over the lower electrode by the ALCVD process; and forming an upper electrode of the capacitor on the capacity insulator film.

8 Claims, 10 Drawing Sheets

METHOD OF FABRICATING A HIGH DIELECTRIC CONSTANT METAL OXIDE CAPACITY INSULATOR FILM USING ATOMIC LAYER CVD

BACKGROUND OF THE INVENTION

FIELD OF THE INVENTION

The present invention relates to a method for fabricating a semiconductor device, especially a method for forming a capacitor structure in the semiconductor device.

DESCRIPTION OF THE PRIOR ART

Among various types of semiconductor device, dynamic RAMs (DRAMs) have been well known in the art as memory devices where the input and output of information can be performed as needed. A typical memory cell of such a DRAM is structurally simple and comprises two components: a transfer transistor and a capacitor. Therefore, it is applied very extensively in various fields because of such a simple circuitry most suitable for providing a highly integrated semiconductor device.

Also, in the latest technology of semiconductor device, system LSIs are becoming important. For providing such semiconductor devices, various mixed semiconductor devices with fundamentally different types of components have been developed and studied, such as a logic-mixed memory device in which a logic circuit and a memory circuit are mounted together on a single semiconductor chip and an analog-mixed logic device in which a logic circuit and an analog circuit are mounted on a single semiconductor chip Just as in the case with the DRAM mentioned above, the mixed semiconductor device has a memory cell consisting of a transfer transistor and a capacitor.

In conjunction with the further increase in integration of semiconductor device, a capacitor having a three-dimensional structure has been developed and used for that memory cell. The reason of fabricating the three-dimensionally structured capacitor is the follow. That is, in connection with the fabrication of finer and denser semiconductor device, the reduction in the occupied area of a capacitor becomes indispensable. In this case, however, the capacity of the capacitor should be kept at more than the predetermined level for ensuring the reliable and stable operation of a memory part of the semiconductor device. Therefore, it becomes indispensable to change the shape of each electrode in the capacitor from a flat shape into a three-dimensional shape so as to expand the surface area of the electrode in its reduced area occupied in the capacitor.

For such a three-dimensional structure of the capacitor in the memory cell, there are two structural designs (i.e., a stack structure and a trench structure). Each of these structures has its own merits and demerits. The stack structure has considerable tolerance to an incident alpha-ray or a noise from any circuit or the like, allowing the operation of the capacitor in stable even at a comparatively small capacitance value. Therefore, such a stack structure may be effective in the process of fabricating a semiconductor device even though the chip employs design rules of approximately 0.10 μm.

Recently, furthermore, the capacitor having the stack structure (hereinafter, such a capacitor is referred to as a stacked-type capacitor) requires a dielectric film (i.e., a capacity insulator film) with an extremely high dielectric constant for ensuring a predetermined capacitance value in a very small area. Therefore, several materials have been intensively studied for the dielectric film. The materials include insulating materials such as tantalum pentoxide ($Ta_2O_5$), $SrTiO_3$ (hereinafter, simply referred to as a STO), a $(Ba, Sr)TiO_3$ (hereinafter, simply referred to as a BST), and $Pb(Zr, Ti)O_3$ (hereinafter, simply referred to as a PZT). Moreover, it becomes necessary to provide a new conductive material to be provided as a lower electrode of the above stacked-type capacitor for the purpose of ensuring a high reliability of the capacitor by means of an appropriate combination of the above high dielectric insulator material with the lower electrode. In the Digest of Technical Papers, pp. 831–834, of the annual IEEE International Electron Devices Meeting (IEDM) held on 1994, a STO film is used as a capacity insulator film and ruthenium dioxide ($RuO_2$) is used as a conductive material of a lower electrode. In addition, the same kind of the capacitor structure can be found in Japanese Patent Application Laying-open No. 2000-114482.

Figure 11A:
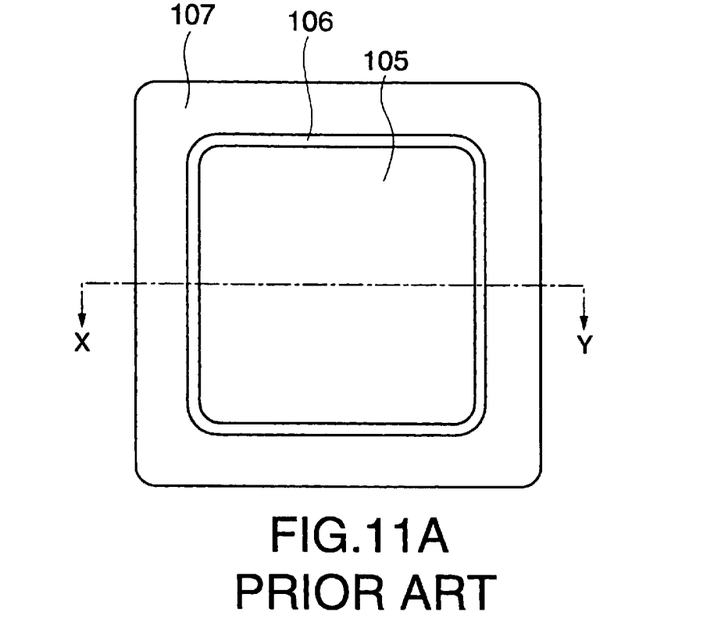
FIG. 11A is a plan view of the conventional MIM-structured capacitor and FIG. 11B is a cross sectional view thereof along the break line X-Y in FIG. 11A.
Figure 11B:
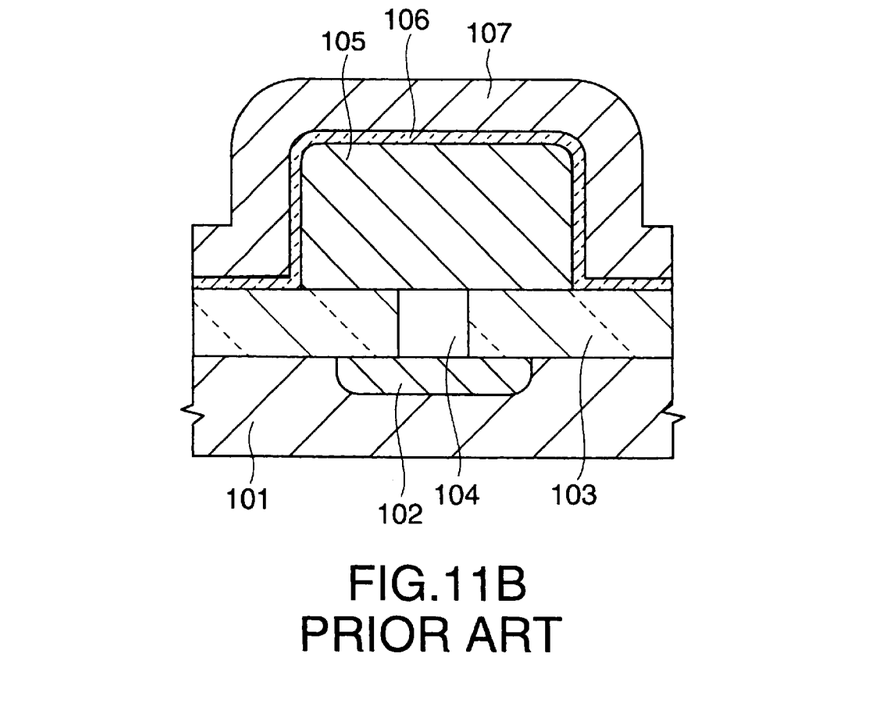

Referring now to FIG. 11A and FIG. 11B, we will describe the configuration of the stacked-type capacitor having the conventional high dielectric constant film. In FIG. 11A, there is shown a schematic plan view of the stacked-type capacitor only with a lower electrode 105, a capacity insulator film 106, and an upper electrode 107 for simplified illustration. FIG. 11B is a cross sectional view of the stacked-type capacitor along the break line X-Y in FIG. 11A.

As shown in FIG. 11B, a diffusion layer 102 with a N-type electric conduction is formed on a predetermined area of the surface of a silicon substrate 101 with a P-type electric conduction. A part of an insulator film 103 on the silicon substrate 101 is opened and filled with a plug 104. Also, the lower electrode 105 is formed on the insulator film 103 so as to directly cover the insulator film 103. Thus, the lower electrode 105 can be electrically connected to the diffusion layer 102 through the plug 104.

As shown in FIG. 11A and FIG. 11B, furthermore, the capacity insulator film 106 is formed on the side and top of the lower electrode 105 and the exposed surface of the interlayer insulator film 103. Here, the interlayer insulator film 103 is made of a metal film such as a ruthenium oxide film, while the capacity insulator film 106 is made of another metal film such as a $Ta_2O_5$ film or a STO film. Then, an upper electrode 107 is formed so as to cover the whole substrate. Here, the upper electrode 107 may be made of the same material as that of the lower electrode 105.

The present inventors have been thoroughly studied about the capacitor having a Metal/Insulator/Metal (MIM) structure in which a high dielectric constant material such as one described above is used as a capacity insulator film. Consequently, they found the fact that a leak current in the capacity insulator film increased as the measuring temperature increased when the capacity insulator film was made of a metal oxide film such as a tantalum pentoxide ($Ta_2O_5$), zirconium dioxide ($ZrO_2$), hafnium dioxide ($HfO_2$), STO ($SrTiO_3$), BST (($Ba,Sr$) $TiO_3$), or PZT ($Pb(Zr,Ti)$ $O_3$) film.

In the following description, we will give a brief explanation of the dependence of the above leak current on measuring temperature with reference to FIG. 12. In this figure, there is shown one of the features of a capacitor having the above MIM structure (hereinafter, simply referred to as a MIM capacitor) in which a STO film is used as its capacity insulator film. In this case, furthermore, the applied voltage between the lower electrode and the upper electrode is in the range of −1 volt to +1 volt.

Figure 12:
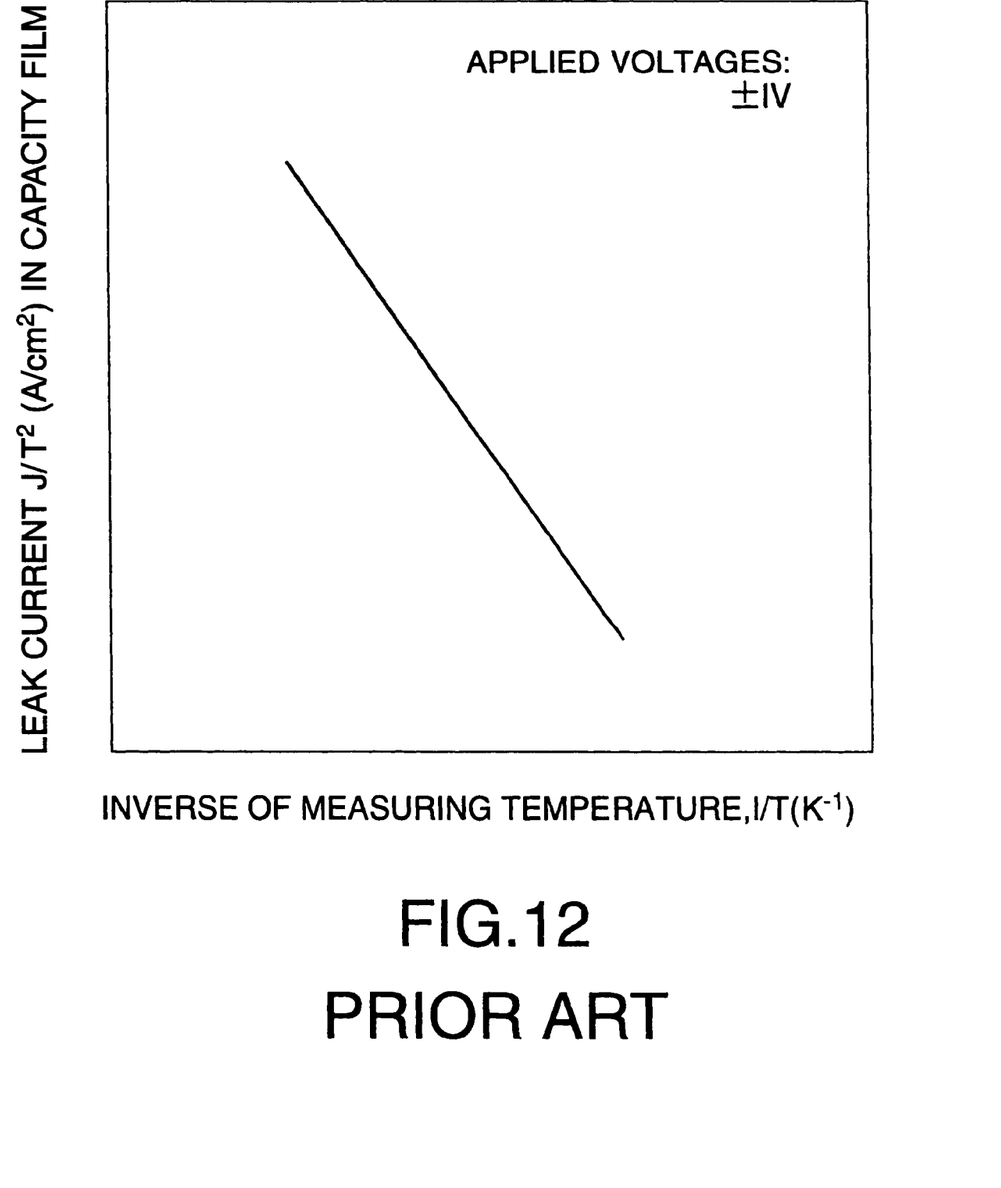
FIG. 12 is a graph for explaining the problems of the prior art, in which the measuring temperature dependency of leak current in the capacity film is illustrated.

In the graph shown in FIG. 12, the horizontal axis represents the inverse (1/T) of an absolute temperature (i.e., a measuring temperature measured in kelvins (K)), while the vertical axis represents the logarithm of leak current ($J/T^2$) in the capacity (insulator) film. As shown in FIG. 12, the leak current ($J/T^2$) in the capacitor is substantially in inverse proportion to the inverse (1/T) of the measuring temperature. In other words, the leak ($J/T^2$) in the capacitor can be restricted with the thermal release of electrons from the lower or upper electrode (i.e., the capacitor electrode) to the capacitive insulator film. In the prior art, therefore, the leak current ($J/T^2$) in the capacity film dramatically increases as the measuring temperature increases. By the way, it is also known that the dependence of such a leak current on temperature is varied with respect to the above applied voltage. Whatever the case may be, however, the leak current is proportional to the measuring temperature.

For operating the semiconductor device, a guaranteed operating temperature of the semiconductor device should be of about 150° C. at maximum. Notably in the case of the logic mixed memory device, the increase in leak current strongly affects on the operation of the device. For such a logic mixed memory device, therefore, there is a growing demand on the MIM capacitor in that its capacity insulator film must be prevented from the increase in leak current even though the operation temperature increases.

BRIEF SUMMARY OF THE INVENTION

1. Object of the Invention

An object of the present invention is to provide a method for fabricating a semiconductor device where the capacitance value of a capacity insulator film made of a metal oxide having a high dielectric constant is increased by a simple procedure.

2. Summary of the Invention

There is provided a method for fabricating a semiconductor device, comprising the steps of: forming a metal film as a lower electrode of a capacitor on a semiconductor substrate, followed by forming a capacity insulator film over the lower electrode by means of atomic layer chemical vapor deposition (ALCVD); and forming an upper electrode of the capacitor on the capacity insulator film.

BRIEF DESCRIPTION OF THE DRAWINGS

The above mentioned and other objects, features and advantages of this invention will become more apparent by reference to the following detailed description of the invention taken in conjunction with the accompanying drawings, wherein.

DETAILED DESCRIPTION OF PREFERRED EMBODIMENTS

Hereinafter, we will describe preferred embodiments of the present invention in detail with reference to the attached drawings.

(First Preferred Embodiment)

Figure 1A:
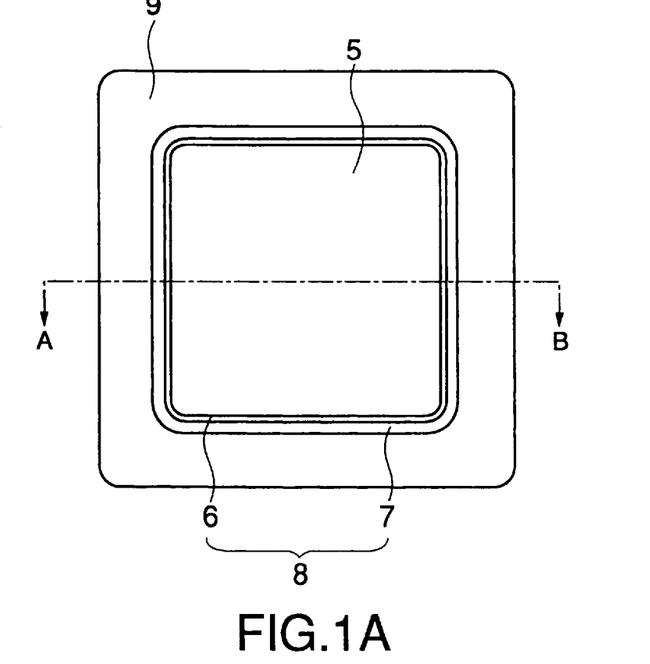
FIG. 1A is a plan view of the MIM capacitor for illustrating the first embodiment of the present invention.
Figure 1B:
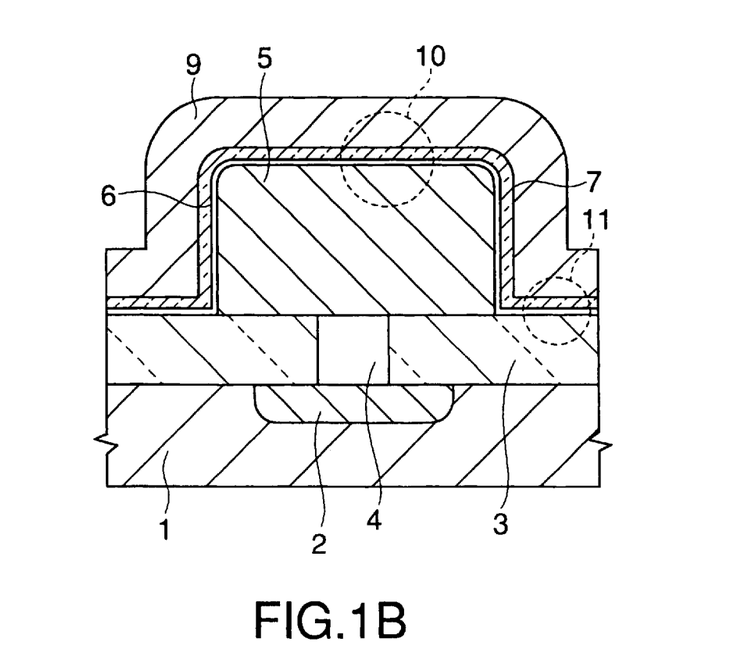
FIG. 1B is a cross sectional view of the MIM capacitor along the break line A-B in FIG. 1A.

Referring to FIG. 1A and FIG. 1B, there is shown a capacitor for illustrating a method for fabricating a semiconductor device as a first preferred embodiment of the present invention. As with the conventional one shown in FIG. 11A and FIG. 11B, the capacitor to be implemented on a semiconductor device is fabricated as follows. First, a silicon substrate 1 with a P-type electric conduction is prepared and a diffusion layer 2 with a N-type electric conduction is then formed on a predetermined area of the surface of the silicon substrate 1. Subsequently, an interlayer insulator film 3 is formed on both the silicon substrate 1 and the diffusion layer 2. Then, a plug 4 is formed by making a hole through a part of an interlayer insulator film 3 so as to extend on the surface of the N-type diffusion layer 2, followed by forming a lower electrode 5 so as to directly cover the surface of the interlayer insulator film 3 and to make an electrical contact with the diffusion layer 2 through the plug 4. In this embodiment, the interlayer insulator film 3 consists of a silicon oxide film, and the plug 4 consists of a barrier film made of titanium nitride (Tin) with tungsten. Also, the lower electrode 5 consists of a metal film made of ruthenium dioxide.

Furthermore, the capacitor of the present embodiment includes first and second dielectric films. The first dielectric film is prepared by covering the surface of the interlayer insulator film 3 and the surface of the lower electrode 5 with an extra-thin barrier insulator layer 6. Here, the barrier insulator layer 6 is an alumina film with a thickness of from 1 nm to 5 nm. Also, the relative dielectric constant of such an alumina film is on the order of 10. In this case, the current passing through the film is Fowler Nordheim (F-N) tunneling current or direct tunneling current mechanism. Subsequently, a high dielectric constant film 7 is provided as the second dielectric film and covers the surface of the barrier insulator layer 6. Here, the high dielectric constant film 7 is made of tantalum pentoxide ($Ta_2O_5$) with a film thickness of about 10 nm. In addition, the $Ta_2O_5$ film has a relative dielectric constant of about 25. As shown in the figures, the barrier insulator layer 6 and the high dielectric constant film 7 make up a capacity insulator film 8.

Moreover, an upper electrode 9 is formed so as to cover the whole of the above structure in fabrication. Here, the upper electrode 9 consists of a metal film made of tungsten or the like.

Accordingly, the MIM capacitor can be fabricated by the above steps in the method of the present embodiment.

Figure 2A:
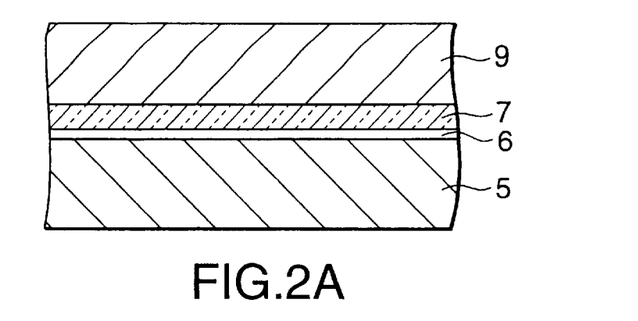
FIGS. 2A and 2B are cross sectional views of enlarged parts of the MIM capacitor shown in FIG. 1A, respectively.
Figure 2B:
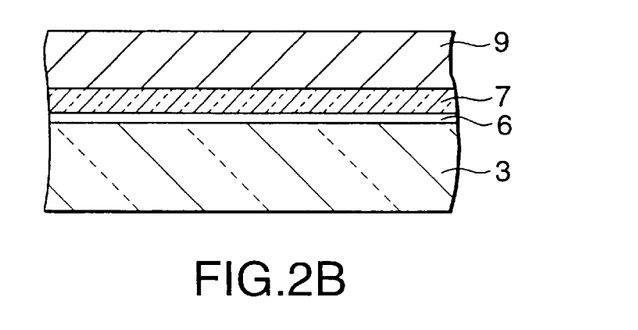

Referring now to FIG. 2A and FIG. 2B, the features of the present embodiment will be further described in detail. FIG. 2A is an enlarged cross sectional view of a portion circled by the break line 10 in FIG. 1B and FIG. 2B is an enlarged cross sectional view of a portion circled by the break line 11 in FIG. 1B.

As shown in FIG. 2A, the barrier insulator layer 6 and the high dielectric constant film 7 are successively formed on the lower electrode 5, and the upper electrode 9 is then formed on the surface of the high dielectric constant film 7. Here, the lower electrode 5 and the upper electrode 9 are metal films as described above. In addition, the lower electrode is the $RuO_2$ film as described above. In this embodiment, alternatively, the lower electrode may be one selected from an $IrO_2$ film, a $RuO_2$/Ru film (i.e., a laminated film where a $RuO_2$ film is deposited on a Ru film), and an $IrO_2$/Ir film (i.e., a laminated film where an $IrO_2$ film is deposited on an Ir film). Furthermore, the lower electrode 5 may be a TiN film, a TaN film, or a WN film, or alternatively a metal film coated with a TiN film or a TaN film. In this embodiment, furthermore, the upper electrode 9 may be prepared from a metal with a high melting point, such as tungsten, in stead of the above metal film.

As described above, the barrier insulator layer 6 is an insulator film having the F-N tunneling current or direct tunneling current mechanism. Such a laminated film 6 may be a silicon oxynitride (SiON) film. That is, the material to be used is one that brings the barrier insulator layer 6 into intimate contact with the above lower electrode 5.

In stead of the $Ta_2O_5$ film, furthermore, the high dielectric constant film 7 may be a metal oxide film such as a zirconium dioxide ($ZrO_2$) film, a hafnium dioxide ($HfO_2$) film, a STO ($SrTiO_3$) film, BST ($(Ba, Sr)TiO_3$) film, or a PZT ($Pb (Zr, Ti)O_3$) film.

As shown in FIG. 2B, furthermore, the barrier insulator layer 6 and the high dielectric constant film 7 are laminated on the interlayer insulator film 3, followed by forming the upper electrode 9 on the surface of the high dielectric constant film 7. Instead of the silicon dioxide film, the interlayer insulator film 3 may be an insulator film based on a Si—O bond. Such an insulator film may be a low dielectric constant film made of a compound selected from silsesquioxanes including hydrogen silsesquioxane, methyl silsesquioxane, methylated hydrogen silsesquioxane, and fluorinated silsesquioxane.

In this embodiment, a matter of great import is that the barrier insulator layer 6 is made of a material that facilitates the cladding to the interlayer insulator film 3. Thus, the cladding of the above alumina film to the above interlayer insulator film can be very strong.

Figure 3A:
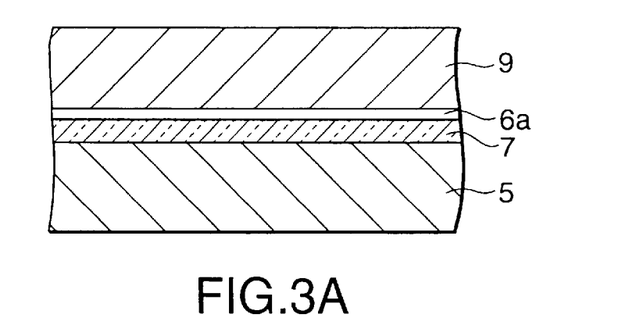
FIGS. 3A and 3B are cross sectional views of enlarged parts of another MIM-structured capacitor, respectively.
Figure 3B:
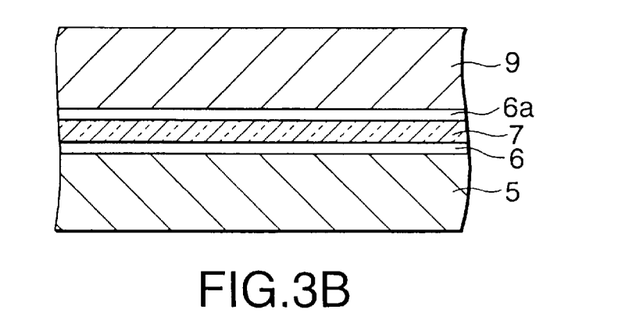

Referring now to FIG. 3, we will describe another configuration of the capacity insulator film in accordance with the present invention.

FIGS. 3A and 3B are enlarged cross sectional views of the MIM capacitor shown in FIGS. 1A and 1B, as in the cases of FIGS. 2A and 2B. In FIG. 3A, the high dielectric constant film 7 is formed and coated on the surface of the lower electrode 5 and then a barrier insulator layer 6a is formed on the surface of the high dielectric constant film, followed by forming the upper electrode 9 on the barrier insulator layer 6a. In FIG. 3B, on the other hand, the barrier insulator film 6 is formed and coated on the surface of the lower electrode 5 and then the high dielectric constant film and the laminated film 6a are successively formed on the barrier insulator film 6, followed by forming the upper electrode 9 on the laminated film 6a.

In such a MIM-structured capacitor, each of the lower electrode 5, the barrier insulator films 6, 6a, the high dielectric constant film 7, and the upper electrode 9 may be the same material as one explained in the description for FIG. 2A.

Referring now to FIGS. 4A and 4B and FIGS. 5A and 5B, we will describe the method for preparing the laminated film 6 and the high dielectric constant film 7 which serve as the building blocks for the MIM capacitor shown in FIGS. 1A and 1B.

Figure 4A:
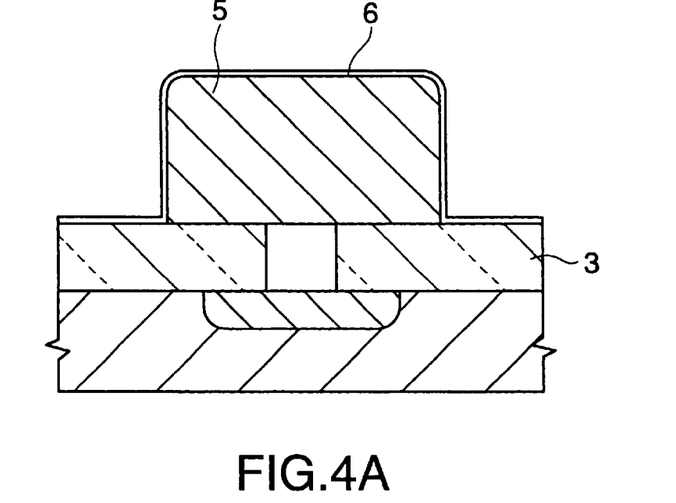
FIG. 4A is a cross sectional view of the capacitor for illustrating the step of forming the capacity insulator film in accordance with the present invention.
Figure 4B:
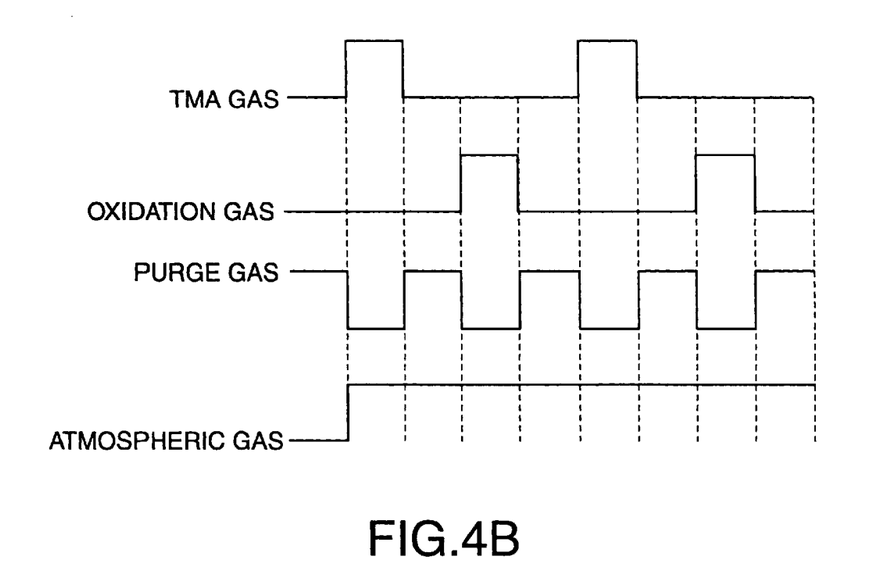
FIG. 4B is a sequence diagram for introducing the reaction gases into the reaction chamber for the ALCVD process.

FIG. 4A is a cross sectional view of the structure after forming the barrier insulator film 6 on both the surface of the interlayer insulator film 3 and the surface of the lower electrode 5. Here, such a barrier insulator film 6 is prepared by means of the atomic layer chemical vapor deposition (ALCVD) (hereinafter, simply referred to as the ALCVD process) A system to be used in this case may be a multiple chamber film formation system. The film formation in the ALCVD process is performed by introducing reaction gases into reaction chambers intermittently as precisely spaced pulses. The sequence of introducing the reaction gases into the chamber is illustrated in FIG. 4B. A semiconductor wafer to be subjected to the film formation is placed on a substrate at a temperature in the range of 200° C. to 350° C. in the chamber.

As shown in FIG. 4B, an atmospheric gas to be introduced into the chamber is an inert gas such as a nitrogen gas or an argon gas and the gas pressure in the chamber is kept at the order of 100Pa. After the introduction of such an atmospheric gas, a trimethyl aluminum (TMA) gas is introduced into the chamber intermittently as precisely spaced pulses. The intermittently spaced introduction of the TMA gas allows the chemical adsorption of TMA or its activated species on both the surface of the interlayer insulator film 3 and the surface of the lower electrode 5. In this embodiment, such a chemical adsorption forms a single atomic layer.

In other words, aluminum atoms in the TMA combine with oxygen atoms or nitrogen atoms so that the chemical adsorption can be attained. Thus, the lower electrode 5 should be a conductive metal film made of metal oxide or metal nitride as illustrated in FIG. 2A. In addition, the interlayer insulator film 3 is an insulator film provided as a silicon oxide film, so that TMA can be easily accumulated on the surface of such a film by means of chemical adsorption.

As shown in FIG. 4B, subsequently, the introduction of TMA gas is interrupted and a purge gas is then introduced into the chamber as a pulse to exhaust the TMA gas from the chamber. Here, the purge gas may be a nitrogen gas, an argon gas, a helium gas. Subsequently, the introduction of purge gas is interrupted and an oxidation gas is then introduced into the chamber as a pulse. The oxidation gas thermally reacts with the TMA or activated species thereof adsorbed on both the surface of the interlayer insulator film 3 and the surface of the lower electrode 5, resulting in the formation of an alumina film at an atomic layer level. In this embodiment, the oxidation gas may be ozone ($O_3$). Then, the purge gas is introduced into the chamber again as a pulse.

The adsorption of TMA or activated species thereof and the oxidation of adsorbed TMA or activated species thereof are provided as events in a unit cycle for forming the alumina film at an atomic layer level. Thus, such a cycle is repeatedly performed to adjust the film thickness of the barrier insulator layer 6. Here, the unit cycle is completed within about one second and the film thickness of the alumina film at the atomic layer level may be in the range of 0.1 nm to 0.2 nm. In the above ALCVD process, therefore, the unit cycle can be repeated ten or twenty times. As a result, the alumina film with a film thickness of 1 nm to 5 nm is formed and provided as a barrier insulator film 6.

For the ALCVD process, it is important to adjust the temperature of the substrate because of the need for preventing the lower electrode 5 from oxidation. In this case, there is no problem when the conductive metal oxide such as the $RuO_2$ film is used. However, oxidation should be prevented when the metal nitride such as the TiN film or the TaN film is used. Here, the oxidation of TiN film can be occurred at a temperature of 450° C. or more, and the oxidation of TaN film can be occurred at a temperature of 500° C. or more. For avoiding such a disadvantage, therefore, the temperature of the substrate in the ALCVD process may be adjusted at 400° C. or less.

As described above, it becomes possible to form the barrier insulator layer 6 having the exceedingly high coating property to both the surface of the interlayer insulator film 3 and the surface of the lower electrode 5 in the ALCVD process.

Figure 5A:
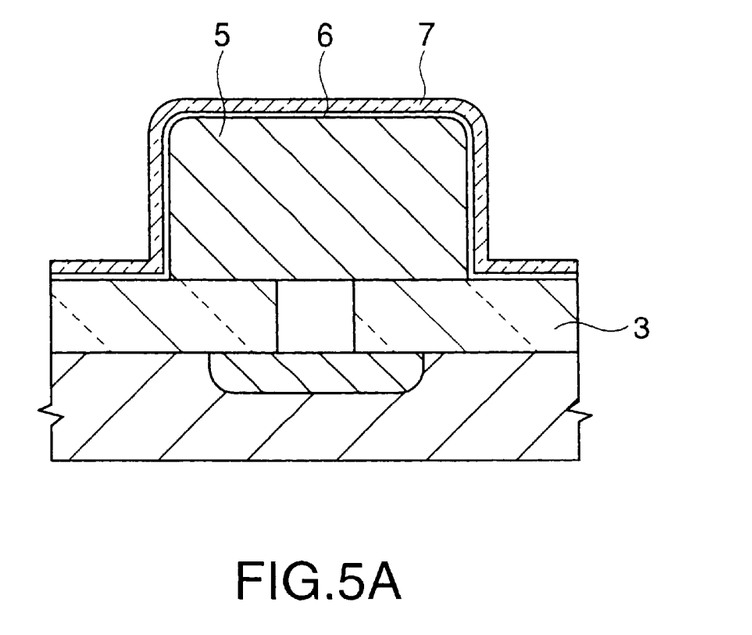
FIG. 5A is a cross sectional view of the capacitor for illustrating the step of forming the capacity insulator film in accordance with the present invention.
Figure 5B:
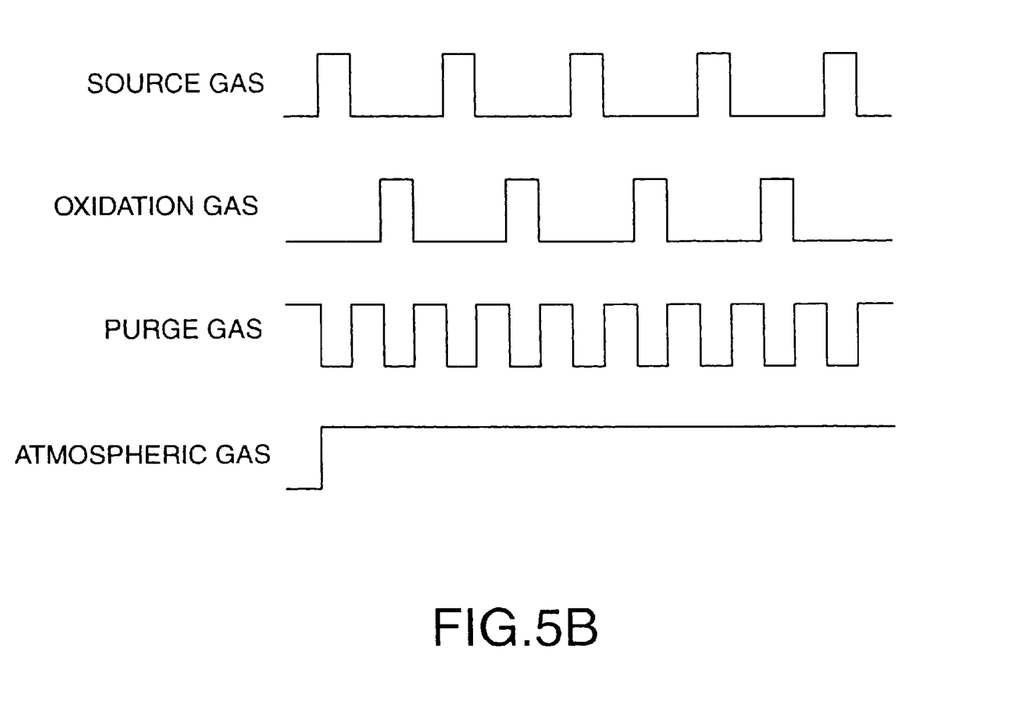
FIG. 5B is a sequence diagram for introducing the reaction gases into the reaction chamber for the ALCVD process.

Next, the high dielectric constant film 7 is formed on the above barrier insulator layer 6. FIG. 5A is a cross sectional view of the structure after forming the high dielectric constant film 7 so as to be coated on the surface of the interlayer insulator film 3 and the surface of the barrier insulator layer 6 on the lower electrode 5. In the following description, we will describe the case in which the high dielectric constant film 7 is formed by the above ALCVD process. In this case, reaction gases are introduced into another chamber of the above multi-chamber film formation system intermittently as spaced pulses. FIG. 5B illustrates the sequence of introducing such reaction gases into the reaction chamber. In this case, also, a semiconductor wafer to be subjected to the film formation is placed on the substrate at a temperature in the range of 200° C. to 350° C. in the above chamber.

As shown in FIG. 5B, an atmospheric gas is introduced into the reaction chamber and the gas pressure in the chamber is kept at the order of 200 Pa. Then, a tantalum tetrachloride ($TaCl_4$) gas is introduced as a source gas into the chamber as intermittently as spaced pulses. Such intermittently spaced introduction of such a source gas allows the chemical adsorption of Ta atoms or tantalum tetrachloride on the surface of the barrier insulator layer 5. In this embodiment, such a chemical adsorption is of a single atomic layer or of several atomic layers. As the Ta atoms combine with oxygen atoms, they can be chemically adsorbed on the surface of the barrier insulator layer 6 without any difficulty.

As shown in FIG. 5B, furthermore, a purge gas is introduced into the chamber as a pulse when the introduction of source gas is interrupted to exhaust the source gas from the chamber. Likewise, an oxidation gas is introduced into the chamber as a pulse during the period of interrupting the introduction of purge gas. The oxidation gas thermally reacts with the adsorbed Ta atoms to form a tantalum pentoxide film at an atomic layer level. In this embodiment, the oxidation gas maybe water vapor ($H_2O$), ozone ($O_3$), or the like. Subsequently, the purge gas is introduced into the chamber again.

The adsorption of Ta atoms and the oxidation of adsorbed Ta atoms are provided as events in a unit cycle for forming the tantalum pentoxide film at an atomic layer level or at several atomic layer levels. Thus, such a cycle is repeatedly performed to adjust the film thickness of the high dielectric constant film 7. Here, the rate of forming such a tantalum pentoxide film is on the order of 5 nm/minute. Therefore, the tantalum pentoxide film of 10 nm in film thickness can be obtained within the order of 2 minutes.

The composition of each of the barrier insulator layer 6 and the high dielectric constant film 7 can be controlled more effectively if each of them is formed by the above ALCVD process. In addition, the ALCVD process allows the extensive improvement on the step coverage characteristics of the capacity insulator film (i.e., the capability of covering the stepped portion to be caused in the film formation). Therefore, the high-quality capacity insulator film having excellent insulation performance can be easily formed. In addition, the problem of oxygen depletion can be solved when the high dielectric constant film is formed by such a process, so that the subsequent step of heat treatment on the high dielectric constant film in an atmosphere of oxygen can be eliminated. The above advantages of using the ALCVD process is not limited to the case in which the tantalum pentoxide film is provided as the high dielectric constant film. Such advantages can be also obtained using the metal oxide film explained in the description for FIG. 2.

(Second Preferred Embodiment)

A second preferred embodiment of the present invention will be now described in detail with reference to FIGS. 6A and 6B and FIGS. 7A and 7B. In this embodiment, a MIM-structured capacitor is formed on a logic device to be fabricated with 0.10-$\mu$m design rules. The effects to be caused as a result of leak current in the capacity insulator film in the capacitor of the present embodiment will be concretely described below.

Figure 6A:
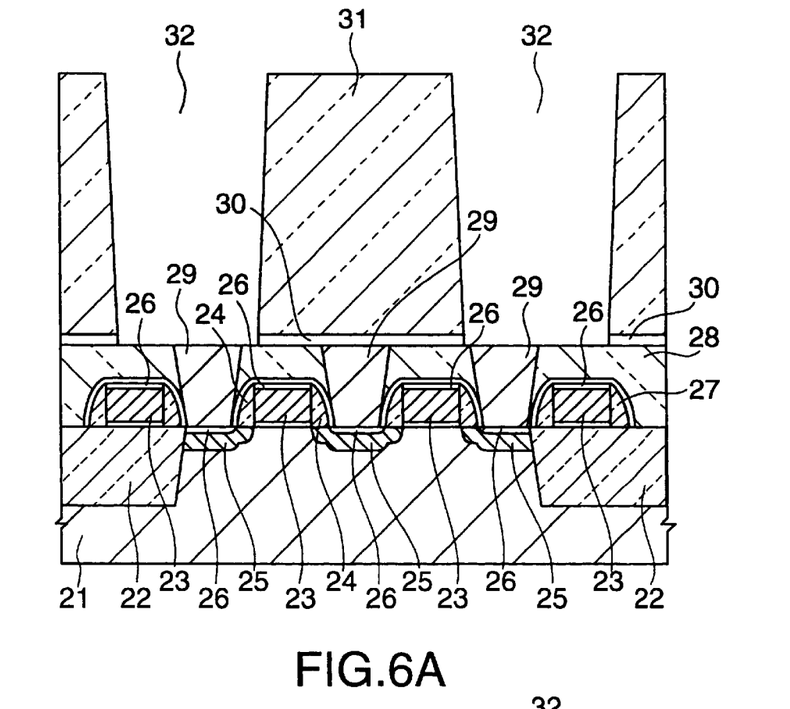
FIGS. 6A and 6B are cross sectional views for illustrating different steps for fabricating the MIM capacitor in accordance with the second embodiment of the present invention, respectively.

As shown in FIG. 6A, at first, a chip separation area 22 is formed on a silicon substrate 21 with a P-type electric conduction by the process of shallow trench isolation (STI). Then, a polycrystal silicon layer 23 is formed on the silicon substrate 21 through a gate insulator film and then a sidewall insulator film 24 is formed on the side wall of the polycrystal silicon layer 23 by the well known process in the art.

Subsequently, a source drain diffusion layer 25 with a N-type electric conduction is formed by means of ion implantation and thermal treatment. Furthermore, using the silicide technology, a silicide layer 26 is selectively formed on the surface of the polycrystal silicon layer 23 and the surface of the source drain diffusion layer 25. In this embodiment, the silicide layer 26 can be made of cobalt silicide.

Then a protective insulator film 27 is formed using a silicon nitride film, followed by depositing a silicon oxide film thereon to form a first interlayer insulator film 28. Subsequently, a predetermined area of the first interlayer insulator film 28 is opened to form a hole to be filled with a plug 29. In this embodiment, the plug 29 consists of tungsten.

Furthermore, a etching stopper layer 30 and a second interlayer insulator film 31 are laminated on the surface of the first interlayer insulator film 28 and the top of the plug 29. Here, the etching stopper 30 is a thin silicon nitride film and the second interlayer insulator film 31 is a silicon oxide film.

The predetermined area of the second interlayer insulator film 31 is subjected to a reactive ion beam etching (RIE) to perform dry etching to form a capacitance hole 32. In this case, the etching stopper layer 30 protects the plug 29 from the dry etching in the RIE process. Then, the subsequent dry etching allows the selective removal of the etching stopper layer 30 to complete the formation of such a hole 32.

Figure 6B:
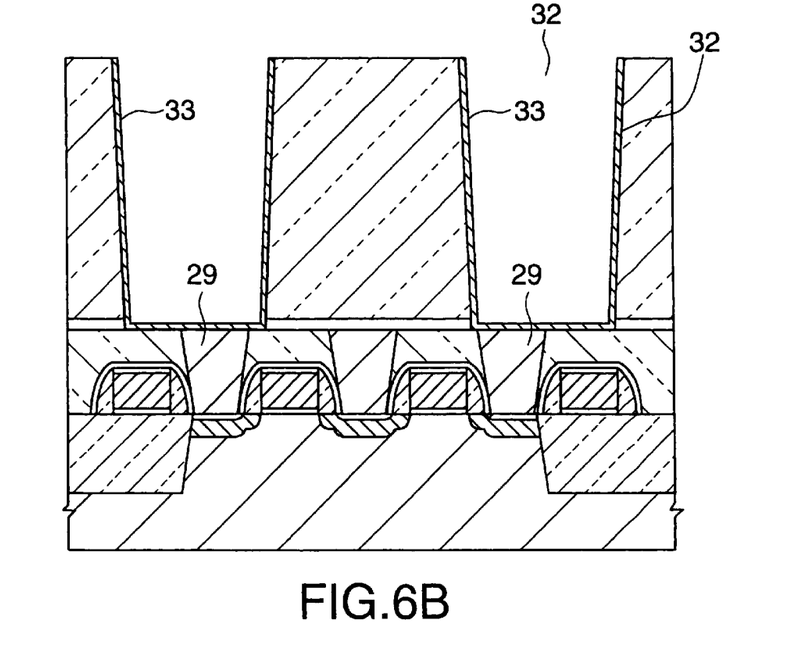

As shown in FIG. 6B, furthermore, a lower electrode 33 is formed along the inner side of the capacitance hole 32. The lower electrode 33 is connected to the plug 29. In this embodiment, the lower electrode 33 consists of a TiN film with a film thickness of about 20 nm.

Figure 7A:
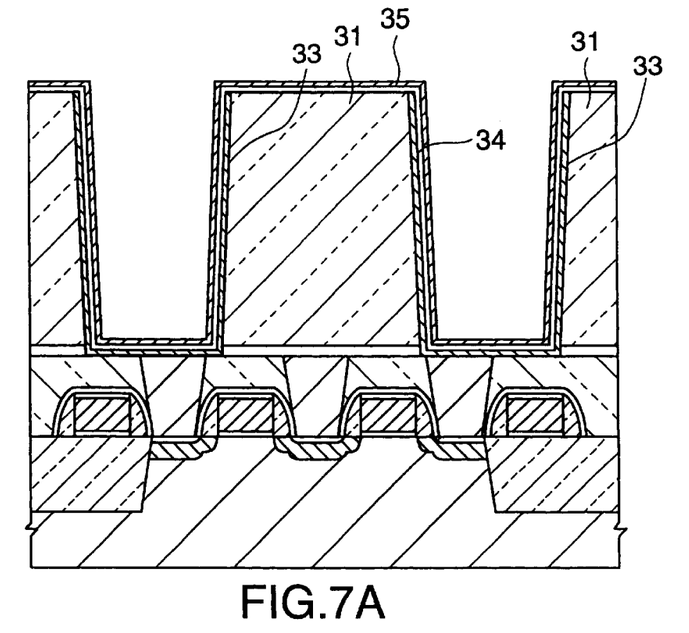
FIGS. 7A and 7B are cross sectional views for illustrating further steps for fabricating the MIM capacitor in accordance with the second embodiment of the present invention, respectively.

Next, as shown in FIG. 7A, as explained in the first preferred embodiment, a barrier insulator layer 34 is formed on the surface of the high lower electrode 33 and the surface of the second interlayer insulator film 31 by depositing an alumina film of 2 nm in film thickness. Then, a high dielectric constant film 35 is formed on the barrier insulator layer 34 by depositing a tantalum pentoxide film of 10 nm in film thickness.

Figure 7B:
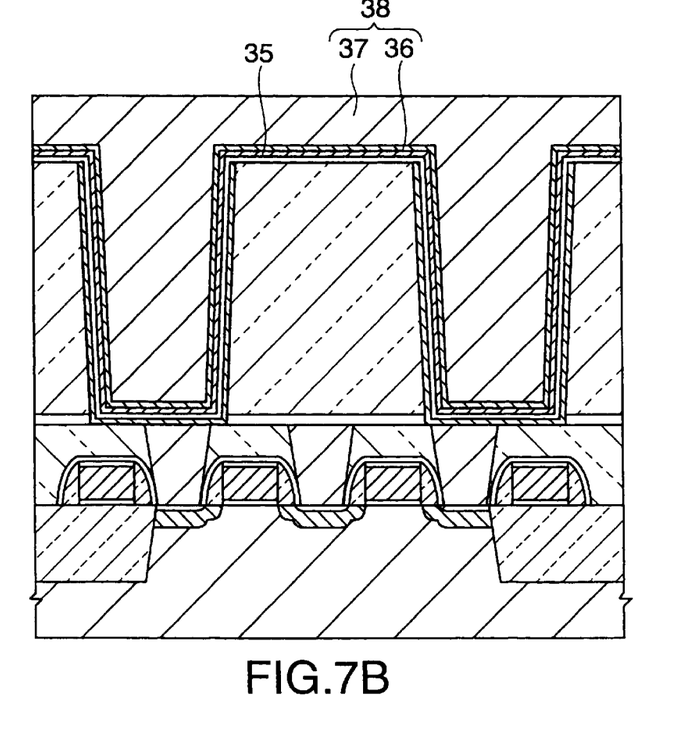

Subsequently, as shown in FIG. 7B, a barrier conductive layer 36 and a tungsten film 37 are successively formed on the high dielectric constant film 35 and are then subjected to the step of pattering using the well known photolithographic and dry etching technologies to make an upper electrode 38, resulting in a basic structure of the MIM capacitor. We investigated the details of leak current occurred in the MIM capacitor thus obtained. The obtained results are represented as a graph shown in FIG. 8. In this figure, the potentials applied between the lower electrode 33 and the upper electrode 38 are plotted on the horizontal axis. To be more specific, the source drain diffusion layer 25 and the silicon substrate 21 are grounded and positive or negative potential is applied on the upper electrode 38. Then, the leak currents in the capacity (insulator) film are plotted on the vertical axis of the graph. In addition, a set of the measuring temperatures 25° C. (room temp.), 85° C., and 125° C. is used as the parameter as shown in the figure.

Figure 8:
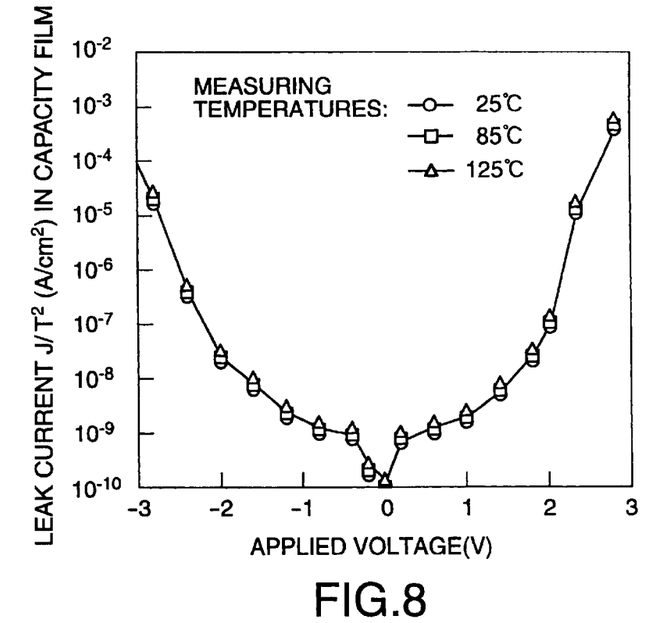
FIG. 8 is a graph for explaining the effects of the present invention.

In the present embodiment, as is evident from FIG. 8, the leak currents in the capacity film do not depend on the measuring temperatures at all. It means that the current passing through the barrier insulator layer 34 has nothing to do with the dependency on temperature. In this embodiment, the flow of electrons in the barrier insulator layer 34 may become Fowler Nordheim (F-N) tunneling current or direct tunneling current mechanism.

Figure 9:
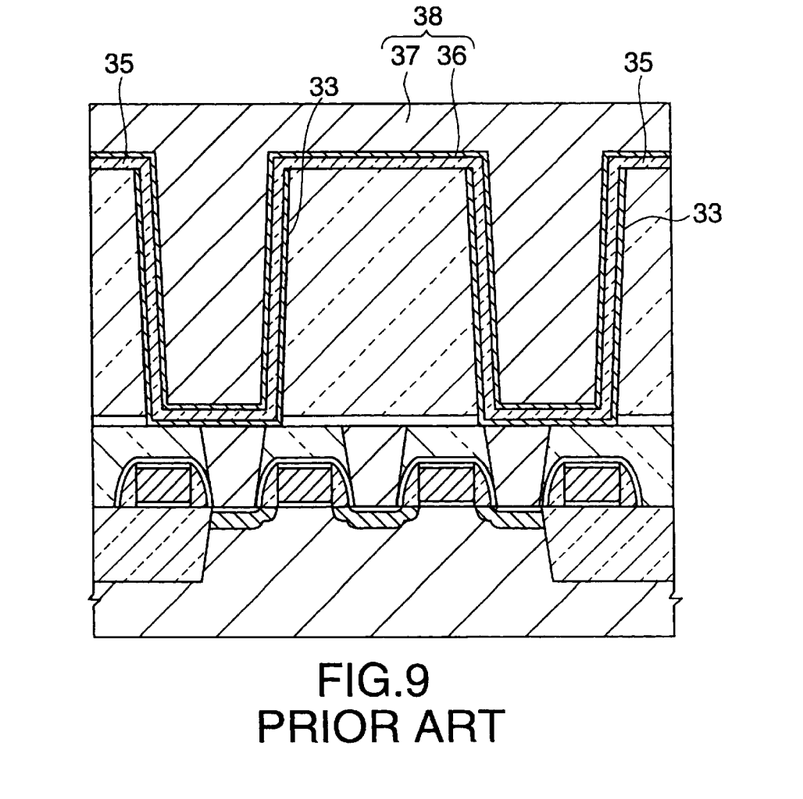
FIG. 9 is a cross sectional view of the conventional MIM-structured capacitor for contrasting with the second embodiment of the present invention.

For comparison, the conventional MIM-structured capacitor-will be described. The configuration of the conventional MIM-structured capacitor is shown in FIG. 9, which is identical to the second preferred embodiment except that a high dielectric constant film 35 formed on the lower electrode 33 is made of a tantalum pentoxide film with a film thickness of 10 nm. In addition, an upper electrode 38 is comprised of a barrier conductive layer 36 and a tungsten film 37 and placed on the high dielectric constant film 35.

Figure 10:
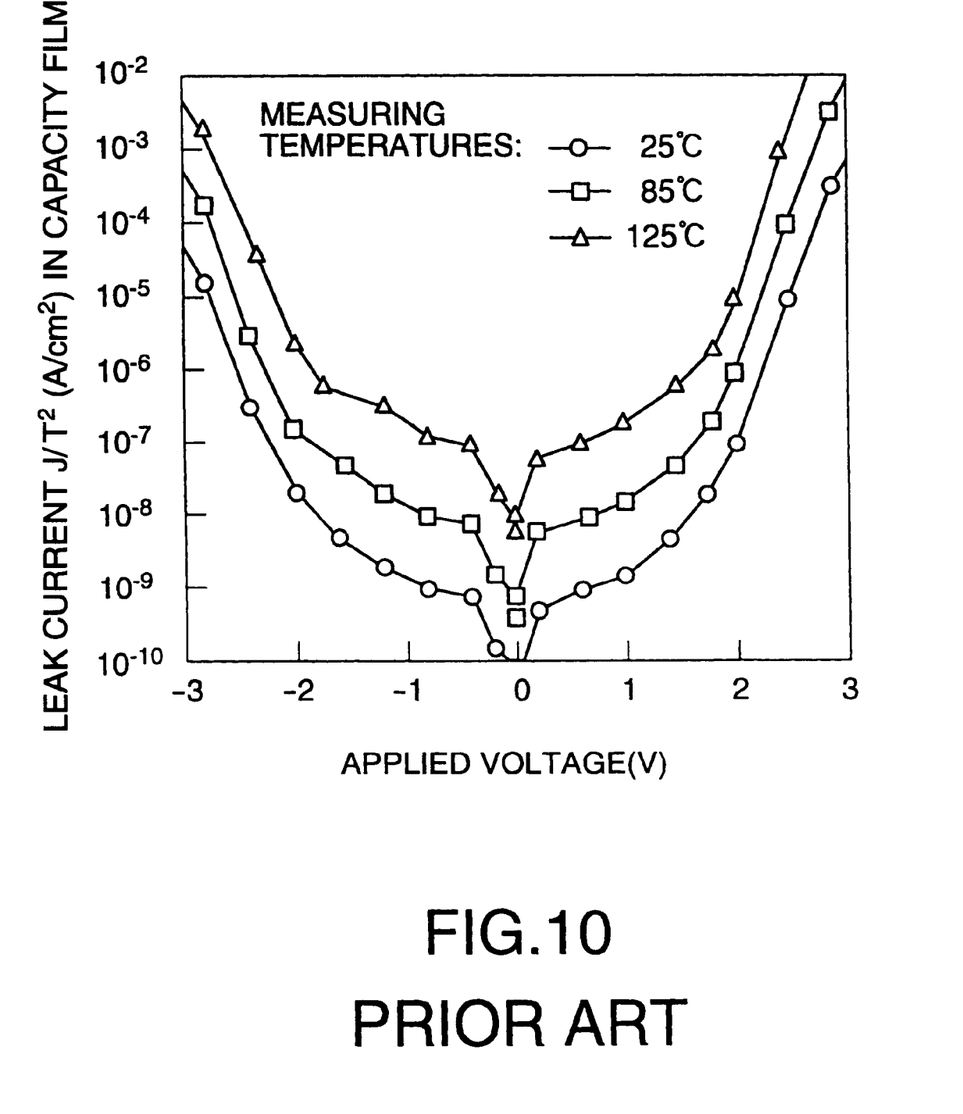
FIG. 10 is a graph for illustrating the generation of leak current in the capacity insulator film of the conventional MIM-structured capacitor.

Leak currents in the conventional MIM-structured capacitor thus obtained were observed. The results shown in FIG. 10 will be explained below. In FIG. 10, currents to be applied between the lower electrode 33 and the upper electrode 38 are plotted on the horizontal axis and leak currents in the capacity (insulator) film are plotted on the vertical axis of the graph. In addition, a set of the measuring temperatures 25° C. (room temp.), 85° C., and 125° C. is used as the parameter as shown in the figure.

As is evident from FIG. 10, in the conventional MIM-structured capacitor, the leak current in the capacity film is excessively dependent on the measuring temperature. That is, the leak current increases as the measuring temperature increases. This is a concrete example of the features of the conventional capacitor shown in FIG. 12.

In the above description, the second embodiment has been explained for the capacitor in which the barrier insulator layer 34 is formed on the surface of the lower electrode 33. However, it is not limited to such a configuration. The dependency of leak current in the capacity insulator film on temperature cannot be observed in each of the designs in which the barrier insulator layer is placed between the high dielectric constant film and the upper electrode, or the barrier insulator layers are respectively placed between the lower electrode and the high dielectric constant film and between the upper electrode and the high dielectric constant film.

In the present embodiment described above, a metal film to be used as the lower or upper electrode may be osmium (Os) or oxide thereof, rhenium (Re), platinum (Pt), palladium (Pd), or rhodium (Rh). In the case of forming the barrier insulator film using the above ALCVD process, there is a need to adsorb oxygen or hydroxyl group on the surface of the metal film such as rhenium (Re), platinum (Pt), palladium (Pd), or rhodium (Rh) Alternatively, such a metal film may be titanium (Ti), tantalum (Ta), ruthenium (Ru), or iridium (Ir). Furthermore, any conductive compound may be used, such as the above metal oxide or the metal nitride, oxynitride, or carbide.

The metal film that makes up the lower or upper electrode may be provided as a laminated material consisting of different metal films.

In the above embodiment, the alumina film or SiON film has been explained as the barrier insulator layer. Alternatively, the barrier insulator film may be any insulator film having the F-N tunneling current or direct tunneling current mechanism.

Furthermore, the preferred embodiment has been explained such that the tantalum pentoxide film is formed by the ALCVD process. In the case of forming a zirconium dioxide ($ZrO_2$) film, a hafnium dioxide ($HfO_2$) film, a STO ($SrTiO_3$) film, or a BST ((Ba, Sr) $TiO_3$) film as a high dielectric constant film by the ALCVD process, the respective source gas as shown in FIG. 5B maybe alcoholate, hafnium chloride, strontiumDRM, barium DRM, or titanium chloride.

The approximate relative dielectric constant of the above high dielectric constant film is 25 for the zirconium dioxide ($ZrO_2$), 30 for the relative dielectric constant of the hafnium dioxide ($HfO_2$) film, 100 for the STO ($SrTiO_3$) film, and 300 for the BST ((Ba, Sr) $TiO_3$) film. In each of these cases, the temperature for film formation may be in the range of 200° C. to 350° C.

Furthermore, if the metal oxide film as described above is prepared by the above ALCVD process, such a film can be used as a capacity insulator film of the MIM capacitor. Alternatively, such a metal oxide film may be provided by stacking the different metal oxide films.

As described above, therefore, in the principal part of the present invention, the MIM capacitor using a high dielectric constant material such a metal oxide film as a capacity insulator film, an insulator film is provided as a barrier insulator layer between a lower electrode or an upper electrode and the high dielectric constant material of the capacitor, where the flow of electrons in the insulator film becomes Fowler Nordheim (F-N) tunneling current or direct tunneling current mechanism. Alternatively, the barrier insulator film or the capacity insulator film may be formed by the ALCVD process.

According to the present invention, consequently, the composition of the capacity insulator film can be controlled more effectively as it is formed by the above ALCVD process. In addition, the ALCVD process allows the extensive improvement on the step coverage characteristics of the capacity insulator film (i.e., the capability of covering the stepped portion to be caused in the film formation). Therefore, the high-quality capacity insulator film having excellent insulation performance and the negligible dependency of its operation on temperature can be easily formed.

After this manner, the operation of the semiconductor device on which the MIM capacitor is mounted becomes very stable. In addition, the stacked type capacitor having the high reliability, in which the high dielectric constant film is used as a capacity insulator film, can be obtained, so that the very high integration and high densification of semiconductor device can be extensively accelerated.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method for fabricating a semiconductor device, comprising the steps of:

forming a metal film as a lower electrode of a capacitor on a semiconductor substrate, followed by forming a capacity insulator film over said lower electrode by means of atomic layer chemical vapor deposition (ALCVD); and forming an upper electrode of said capacitor on said capacity insulator film.

2. A method for fabricating a semiconductor device as claimed in claim 1, wherein said capacity insulator film is comprised of a first dielectric film and a second dielectric film, where said first dielectric film is coated on said lower electrode or on said second dielectric film by means of atomic layer chemical vapor deposition (ALCVD).

3. A method for fabricating a semiconductor device as claimed in claim 2, wherein said first dielectric film consists of an alumina film and said second dielectric film consists of a metal oxide film.

4. A method for fabricating a semiconductor device as claimed in claim 3, wherein said metal oxide film is one selected from a group consisting of a $Ta_2O_5$ film, a $ZrO_2$ film, a $HfO_2$ film, a $SrTiO_3$ film, a $(Ba, Sr)TiO_3$ film, and a $Pb(Zr, Ti)O_3$ film.

5. A method for fabricating a semiconductor device as claimed in claim 2, wherein said first dielectric film is coated on said lower electrode or on said second dielectric film by the process of an atomic layer chemical vapor deposition (ALCVD) in which reaction gases include trimethyl aluminum (TMA) and an oxidation gas.

6. A method for fabricating a semiconductor device as claimed in claim 1, wherein said capacity insulator film is one selected from a group consisting of a $Ta_2O_5$ film, a $ZrO_2$ film, a $HfO_2$ film, a $SrTiO_3$ film, a $(Ba, Sr)TiO_3$ film, and a $Pb(Zr, Ti)O_3$ film.

7. A method for fabricating a semiconductor device as claimed in claim 1, wherein said metal film consists of a metal oxide or a metal nitride.

8. A method for fabricating a semiconductor device as claimed in claim 7, wherein said metal oxide is $RuO_2$ or $IrO_2$ and said metal nitride is one selected from a group of TiN, TaN, and WN.

* * * * *